United States Patent
Nishijima et al.

(10) Patent No.: US 12,221,550 B2
(45) Date of Patent: Feb. 11, 2025

(54) METAL PARTICLE COMPOSITION, METHOD FOR PRODUCING METAL PARTICLE COMPOSITION, AND PASTE

(71) Applicant: KURARAY CO., LTD., Okayama (JP)

(72) Inventors: Yuki Nishijima, Tainai (JP); Daiki Noguchi, Kurashiki (JP); Takashi Fukumoto, Tainai (JP)

(73) Assignee: KURARAY CO., LTD., Okayama (JP)

( * ) Notice: Subject to any disclaimer, the term of this patent is extended or adjusted under 35 U.S.C. 154(b) by 192 days.

(21) Appl. No.: 17/792,009

(22) PCT Filed: Jun. 30, 2021

(86) PCT No.: PCT/JP2021/024693
§ 371 (c)(1),
(2) Date: Jul. 11, 2022

(87) PCT Pub. No.: WO2022/019069
PCT Pub. Date: Jan. 27, 2022

(65) Prior Publication Data
US 2023/0060171 A1    Mar. 2, 2023

(30) Foreign Application Priority Data
Jul. 20, 2020   (JP) .................................. 2020-123866

(51) Int. Cl.
| | |
|---|---|
| C09D 11/52 | (2014.01) |
| B22F 1/102 | (2022.01) |
| C09C 1/62 | (2006.01) |
| C09C 3/08 | (2006.01) |
| C09D 11/037 | (2014.01) |
| H01B 1/22 | (2006.01) |

(52) U.S. Cl.
CPC .............. *C09D 11/52* (2013.01); *B22F 1/102* (2022.01); *C09C 1/627* (2013.01); *C09C 3/08* (2013.01); *C09D 11/037* (2013.01); *H01B 1/22* (2013.01); *B22F 2301/10* (2013.01); *B22F 2301/35* (2013.01); *C01P 2006/40* (2013.01)

(58) Field of Classification Search
None
See application file for complete search history.

(56) References Cited

U.S. PATENT DOCUMENTS

| | | |
|---|---|---|
| 3,644,568 A | 2/1972 | Tilley et al. |
| 4,781,980 A | 11/1988 | Yoshitake et al. |
| 2006/0240259 A1 | 10/2006 | Toyoda et al. |
| 2016/0060490 A1 | 3/2016 | Uchida et al. |
| 2018/0169755 A1 | 6/2018 | Tagami et al. |

FOREIGN PATENT DOCUMENTS

| | | | |
|---|---|---|---|
| JP | S61-101518 A | 5/1986 | |
| JP | 2009070916 A * | 4/2009 | ............ H01L 24/29 |
| JP | 2010-189681 A | 9/2010 | |
| JP | 2013-108005 A | 6/2013 | |
| JP | 2013189504 A * | 9/2013 | |
| JP | 2016-138296 A | 8/2016 | |
| TW | 200700509 | 1/2007 | |
| WO | 2014/162990 A1 | 10/2014 | |
| WO | 2016/199811 A1 | 12/2016 | |

OTHER PUBLICATIONS

ISR issued in International Patent Application No. PCT/JP2021/024693, Aug. 10, 2021, English translation.
EESR issued in EP Patent Application No. 21847399.9, Dec. 15, 2022.

* cited by examiner

*Primary Examiner* — Tanisha Diggs
(74) *Attorney, Agent, or Firm* — GREENBLUM & BERNSTEIN, P.L.C.

(57) ABSTRACT

To provide a metal particle composition having excellent oxidation resistance, which does not require a transition metal catalyst and can be applied to existing metal particles, a method for producing the metal particle composition, and a paste. The metal particle composition contains, with respect to 100 parts by mass of metal particles, 0.1 to 5 parts by mass of a compound (A) having a structure represented by the following general formula (I):

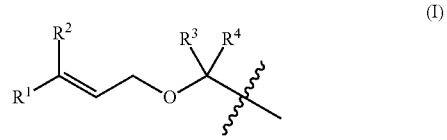

in which $R^1$ and $R^2$ each independently represent a hydrogen atom, an alkyl group having 1 to 6 carbon atoms, an alkenyl group having 2 to 6 carbon atoms, an aryl group, or an aralkyl group, $R^3$ and $R^4$ each independently represent a hydrogen atom, an alkyl group having 1 to 6 carbon atoms, an alkoxy group, an alkenyl group having 2 to 6 carbon atoms, an alkenyloxy group, an aryl group, or an aralkyl group.

20 Claims, No Drawings

METAL PARTICLE COMPOSITION, METHOD FOR PRODUCING METAL PARTICLE COMPOSITION, AND PASTE

TECHNICAL FIELD

The present invention relates to a metal particle composition, a method for producing a metal particle composition, and a paste.

BACKGROUND ART

In the related art, metal particles have been used in various applications, and for example, applications such as a raw material powder for powder metallurgy a baking paste for a multilayer ceramic capacitor, and a material used for a conductive paste or a conductive ink for forming a wiring by inkjet printing or the like have been known.

In recent years, a need for miniaturizing the metal particles has increased. A main reason therefor is that sintering of the metal particles proceeds at a lower temperature since a melting point of the metal particles is reduced by miniaturizing the metal particles. The miniaturization of the metal particles enables to apply the metal particles or a paste containing the metal particles to a base material which has low heat resistance and has been difficult to apply in the past. Further, with miniaturization of electronic components, a finer electronic circuit is required, and metal particles having a smaller particle diameter are required for wiring formation.

Meanwhile, due to the miniaturization of the metal particles, a specific surface area increases for the metal particles as a whole. Therefore, surfaces of the metal particles are likely to be oxidized, and problems such as a decrease in thermal conductivity and an increase in electrical resistance are likely to occur after sintering of the metal particles.

As a method for solving these problems, PTLs 1 and 2 propose a method for covering a particle surface with collagen or citric acid during production of the metal particles. PTL 3 proposes a method for adding ethanolamines as an antioxidant. Although the antioxidant of the metal particles is not described, PTLs 4 and 5 describe a technique of using allyl glycidyl ether or the like as an oxygen absorber.

CITATION LIST

Patent Literature

PTL 1: JP 2010-189681 A
PTL 2: JP 2016-138296 A
PTL 3: JP 2013-108005 A
PTL 4: JP S61-101518 A
PTL 5: U.S. Pat. No. 3,644,568 specification

SUMMARY OF INVENTION

Technical Problem

However, in the related method described in each of Patent Literatures, it still cannot be said that the antioxidation of the metal particles is sufficient, and in particular, the problems caused by oxidation when the metal particles are miniaturized are difficult to be prevented, and there is room for improvement. In particular, the production methods described in PTLs 1 and 2 include a step of forming a covering layer during granulation of the metal particles, and there is a problem that the production methods are complicated and existing metal particles cannot be covered. Therefore, a measure for preventing oxidation of the metal particles, which is different from the methods including a special step as described in PTLs 1 and 2, has been required. Further, a general oxygen absorber used for an object other than the metal particles cannot be simply applied to the metal particles. For example, an oxygen absorber containing a transition metal catalyst as described in PTLs 4 and 5 leads to introduction of heterogeneous metals, and thus the oxygen absorber is difficult to be applied to the metal particles.

The present invention is made in view of the problems in the related art, and an object of the present invention is to provide a metal particle composition having excellent oxidation resistance which does not require a transition metal catalyst and is applicable to existing metal particles, and a method for producing the metal particle composition.

Solution to Problem

As a result of intensive studies to achieve the object, the present inventors have found that a metal particle composition having excellent oxidation resistance, which does not require a transition metal catalyst and is applicable to existing metal particles, is obtained by using a compound having a specific structure containing an unsaturated double bond together with metal particles, and have completed the present invention.

That is, the present invention provides the following [1] to [8].

[1] A metal particle composition containing, with respect to 100 parts by mass of metal particles, 0.1 to 5 parts by mass of a compound (A) having a structure represented by the following general formula (I).

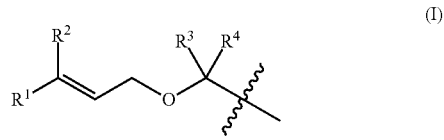

(In the general formula (I), $R^1$ and $R^2$ each independently represent a hydrogen atom, an alkyl group having 1 to 6 carbon atoms, an alkoxy group having 1 to 6 carbon atoms, an alkenyl group having 2 to 6 carbon atoms, an aryl group, or an aralkyl group. $R^3$ and $R^4$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group.)

[2] The metal particle composition according to the above [1], in which $R^1$ and $R^2$ in the general formula (I) are each independently an alkyl group having 1 to 4 carbon atoms.

[3] The metal particle composition according to the above [1] or [2], in which the metal particles are made of at least one metal selected from a group consisting of copper and iron.

[4] The metal particle composition according to any one of the above [1] to [3], in which the compound (A) having the structure represented by the general formula (I) is a compound having a structure represented by the following general formula (II).

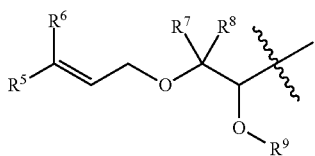

(II)

(In the general formula (II), $R^5$ and $R^6$ each independently represent an alkyl group having 1 to 6 carbon atoms, an alkoxy group having 1 to 6 carbon atoms, an alkenyl group having 2 to 6 carbon atoms, an aryl group, or an aralkyl group. $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group. $R^9$ represents a hydrogen atom, a (meth)acryl group, an alkyl group having 1 to 6 carbon atoms, an alkenyl group having 2 to 6 carbon atoms, an aryl group, or an aralkyl group.)

[5] The metal particle composition according to any one of the above [1] to [4], in which at least a part of the compound (A) is attached to the metal particles.

[6] A method for producing the metal particle composition according to any one of the above [1] to [5], the method including a mixing step of mixing the metal particles and the compound (A).

[7] The method for producing a metal particle composition according to the above [6], the method further including a solvent removing step of removing an organic solvent after the metal particles, the compound (A), and the organic solvent are mixed in the mixing step.

[8] A paste containing the metal particle composition according to any one of the above [1] to [5].

Advantageous Effects of Invention

According to the present invention, it is possible to provide a metal particle composition having excellent oxidation resistance which does not require a transition metal catalyst and is applicable to existing metal particles, a method for producing the metal particle composition, and a paste.

DESCRIPTION OF EMBODIMENTS

[Metal Particle Composition]

A metal particle composition according to an embodiment of the present invention is a metal particle composition containing metal particles and a compound (A) having a structure represented by the following general formula (I). The metal particle composition contains 0.1 to 5 parts by mass of the compound (A) with respect to 100 parts by mass of the metal particles.

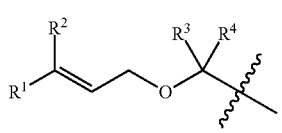

(I)

(In the general formula (I), $R^1$ and $R^2$ each independently represent a hydrogen atom, an alkyl group having 1 to 6 carbon atoms, an alkoxy group having 1 to 6 carbon atoms, an alkenyl group having 2 to 6 carbon atoms, an aryl group, or an aralkyl group. $R^3$ and $R^4$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group.)

Since the metal particle composition contains the compound (A) which is a specific compound having an unsaturated double bond, oxidation resistance of the metal particle composition is improved. The reason is not limited to the above, but is considered to be as follows.

When the compound (A) having the structure represented by the general formula (I) is added to the metal particles, a moiety derived from an allyl ether skeleton of the compound (A) traps oxygen by a radical-mediated reaction, and therefore, the oxygen present on a surface or in a vicinity of surfaces of the metal particles is absorbed and removed by the compound (A). Accordingly it is estimated that oxidation of the metal particles due to the oxygen is prevented.

In particular, since the compound (A) has an ether skeleton exhibiting an electron donating property next to an allyl position, an electron density at the allyl position is easily increased. Since the ether skeleton is formed by an oxygen atom, stability of the compound (A) is higher than a case of being formed by the other chalcogen atoms, and production is also easy.

Since the compound (A) containing no metal absorbs the oxygen by an organic substance only it enables to improve the oxidation resistance of the metal particles without using a transition metal catalyst, and to avoid a problem of mixing an unintended metal.

In addition, since the compound (A) may exist in the vicinity of the metal particles, by mixing the compound (A) with the metal particles, the compound (A) is applicable to the existing metal particles without undergoing a special step so as to improve the oxidation resistance of the obtained metal particle composition.

The metal particle composition may be a mixture of the compound (A) and the metal particles, or may be a composition in which at least a part of the compound (A) is attached to the metal particles. The surfaces of the metal particles may be covered with the compound (A). In the mixture of the compound (A) and metal particles, a part of the compound (A) may be attached to the surfaces of the metal particles or cover the surfaces of the metal particles.

<Metal Particle>

The metal particles contained in the metal particle composition are not particularly limited as long as they are particles made of metal, and various metal particles can be used. Examples of the metal constituting the metal particles include copper, silver, iron, nickel, tin, lead, and titanium.

The metal may be an alloy if the metal contains any element, and the metal may contain an element other than a metal element, such as hydrogen, oxygen, carbon, nitrogen, and sulfur, if the metal contains any element. A mixed particle containing two or more of these metals may be used. Preferably, the metal particle is made of at least one metal selected from a group consisting of copper and iron. Among these metals, copper or iron is preferable, and copper is more preferable, from a viewpoint of easily exhibiting high performance inherent in the metal such as conductivity.

A shape of the metal particles is not particularly limited, and examples of the shape include a granule shape, a pellet shape, a flake shape, a spherical shape, a needle shape, a stick shape, and a disk shape. Among these shapes, the shape is preferably the spherical shape. When the metal particles have a spherical shape, fluidity is easily improved.

A maximum particle diameter of the metal particles is not particularly limited, and is preferably 1 nm to 100 µm, more preferably 0.1 µm to 10 µm, and still more preferably 1 µm to 3 µm.

In the present specification, the maximum particle diameter of the metal particle means a maximum length of straight lines passing through a center of gravity of a metal particle. Therefore, when the metal particles have a spherical shape, the maximum particle diameter corresponds to a diameter.

A specific surface area of an entire metal powder containing the metal particles is preferably 3 $m^2/g$ to 20 $m^2/g$ from a viewpoint of conductivity. The specific surface area can be measured by a known BET method.

Such metal particles are obtained by making metal into particles, and can be produced by various known production methods. Commercially available metal particles may be used.

A content of the metal particles in the metal particle composition is preferably 70 mass % to 99.9 mass %, more preferably 80 mass % to 99.8 mass %, and still more preferably 90 mass % to 99.7 mass %. When the content of the metal particles is equal to or more than the lower limit, a necessary amount of metal may be easily ensured, and necessary physical properties such as conductivity may be easily ensured. When the content of the metal particles is equal to or less than the upper limit, the content of the compound (A) is relatively increased, and thus the oxidation resistance of the metal particle composition may be easily improved.

<Compound (A) Having Structure Represented by General Formula (I)>

As described above, the compound (A) has the structure represented by the following general formula (I).

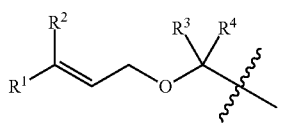

(I)

In the general formula (I). $R^1$ and $R^2$ each independently represent a hydrogen atom, an alkyl group having 1 to 6 carbon atoms, an alkoxy group having 1 to 6 carbon atoms, an alkenyl group having 2 to 6 carbon atoms, an aryl group, or an aralkyl group.

Examples of the alkyl group having 1 to 6 carbon atoms represented by $R^1$ and $R^2$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, an n-hexyl group, a cyclopropyl group, a cyclobutyl group, a cyclopentyl group, and a cyclohexyl group.

Examples of the alkoxy group having 1 to 6 carbon atoms represented by $R^1$ and $R^2$ include a methoxy group, an ethoxy group, an n-propyloxy group, an isopropyloxy group, a butyloxy group, and a hexyloxy group.

Examples of the alkenyl group having 2 to 6 carbon atoms represented by $R^1$ and $R^2$ include a vinyl group, an allyl group, a propenyl group, an isopropenyl group, a butenyl group, an isobutenyl group, a pentenyl group, a prenyl group, a hexenyl group (a cis-3-hexenyl group or the like), and a cyclohexenyl group.

The aryl group represented by $R^1$ and $R^2$ is preferably an aryl group having 6 to 18 carbon atoms from a viewpoint of ease of production, and examples thereof include a phenyl group, a tolyl group, an xylyl group, and a naphthyl group.

The aralkyl group represented by $R^1$ and $R^2$ is preferably an aralkyl group having 7 to 18 carbon atoms from the viewpoint of ease of production, and examples thereof include a benzyl group, a 2-phenylethyl group, a 2-naphthylethyl group, and a diphenylmethyl group.

Among these groups, from a viewpoint of improving the oxidation resistance of the metal particle composition, $R^1$ and $R^2$ are each independently preferably an alkyl group having 1 to 6 carbon atoms or an alkenyl group having 2 to 6 carbon atoms, more preferably an alkyl group having 1 to 4 carbon atoms, and still more preferably a methyl group.

In the general formula (I), $R^3$ and $R^4$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group.

Examples of the alkenyloxy group having 2 to 6 carbon atoms represented by $R^3$ and $R^4$ include a vinyloxy group, a 1-propenyloxy group, a 2-n-propenyloxy group (allyloxy group), a 1-n-butenyloxy group, and a prenyloxy group.

Examples of the alkyl group having 1 to 6 carbon atoms, the alkoxy group having 1 to 6 carbon atoms, the alkenyl group having 2 to 6 carbon atoms, the aryl group, and the aralkyl group which are represented by $R^3$ and $R^4$ are the same as those for $R^1$ and $R^2$, and duplicate descriptions will be omitted.

Among these groups, $R^3$ and $R^4$ are each independently preferably a hydrogen atom, an alkyl group having 1 to 3 carbon atoms, an alkenyl group having 2 or 3 carbon atoms, or an aryl group, more preferably a hydrogen atom or a methyl group, and still more preferably a hydrogen atom. From the viewpoint of improving the oxidation resistance of the obtained metal particle composition, both of $R^3$ and $R^4$ are preferably a hydrogen atom.

The compound (A) having the structure represented by the general formula (I) is preferably a compound having a structure represented by the following general formula (II) from the viewpoint of improving the oxidation resistance of the metal particle composition.

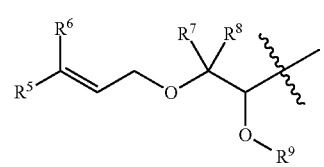

(II)

(In the general formula (II), $R^5$ and $R^6$ each independently represent an alkyl group having 1 to 6 carbon atoms, an alkoxy group having 1 to 6 carbon atoms, an alkenyl group having 2 to 6 carbon atoms, an aryl group, or an aralkyl group. $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group. $R^9$ represents a hydrogen atom, a (meth)acryl group, an alkyl group having 1 to 6 carbon atoms, an alkenyl group having 2 to 6 carbon atoms, an aryl group, or an aralkyl group.)

In the general formula (II), examples of the alkyl group having 1 to 6 carbon atoms, the alkoxy group having 1 to 6 carbon atoms, the alkenyl group having 2 to 6 carbon atoms, the aryl group, and the aralkyl group represented by $R^5$ and $R^6$ are the same as those for $R^1$ and $R^2$.

Examples of the alkyl group having 1 to 6 carbon atoms, the alkoxy group having 1 to 6 carbon atoms, the alkenyl group having 2 to 6 carbon atoms, the alkenyloxy group having 2 to 6 carbon atoms, the aryl group, and the aralkyl group represented by $R^7$ and $R^8$ are the same as those for $R^3$ and $R^4$.

Examples of the alkyl group having 1 to 6 carbon atoms, the alkenyl group having 2 to 6 carbon atoms, the aryl group, and the aralkyl group represented by $R^9$ are the same as those for $R^1$ and $R^2$.

The compound (A) is, for example, a compound having a molecular structure represented by at least one of the following general formulas (III) to (VII). From the viewpoint of improving the oxidation resistance of the metal particle composition and increasing the stability of the compound (A), the compound (A) is preferably a compound represented by at least one of the general formulas (III) to (VI), and more preferably a compound represented by at least one of the general formulas (III), (V), and (VI).

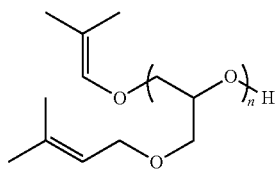

(III)

(Here, the compound represented by the general formula (III) has a weight average molecular weight (Mw) in terms of polystyrene of 200 to 50,000.)

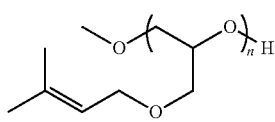

(IV)

(Here, the compound represented by the general formula (IV) has a weight average molecular weight (Mw) in terms of polystyrene of 200 to 50,000.)

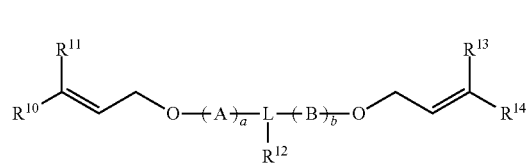

(V)

(In the general formula (V), $R^{10}$, $R^{11}$, $R^{13}$, and $R^{14}$ each independently represent an alkyl group having 1 to 6 carbon atoms, an alkoxy group having 1 to 6 carbon atoms, an alkenyl group having 2 to 6 carbon atoms, an aryl group, or an aralkyl group. $R^{12}$ represents any one of a hydroxy group, a (meth)acryloyloxy group, a 4-vinylphenoxy group, and an alkenyloxy group having 2 to 6 carbon atoms. L represents an alkylene group having 1 to 6 carbon atoms and having $R^{12}$ as a substituent. A and B each independently represent a substituted or unsubstituted alkylene group having 1 to 6 carbon atoms. a and b each independently represent 0 or an integer of 1 to 100.)

In the general formula (V), $R^{12}$ is preferably a hydroxy group or a (meth)acryloyloxy group. The alkenyloxy group having 2 to 6 carbon atoms may be a vinyloxy group having 2 carbon atoms.

Examples of the alkenyloxy group represented by $R^{12}$ include a vinyloxy group, a 1-propenyloxy group, a 2-n-propenyloxy group (allyloxy group), a 1-n-butenyloxy group, and a prenyloxy group.

In the general formula (V), examples of the substituent in the case where A and B have a substituent include substituents the same as those for $R^{12}$. The same applies to the examples, and duplicate descriptions will be omitted.

Examples and preferred examples of $R^{10}$, $R^{11}$, $R^{13}$, and $R^{14}$ in the general formula (V) are the same as those for $R^1$ and $R^2$ in the general formula (I), and thus duplicate descriptions will be omitted.

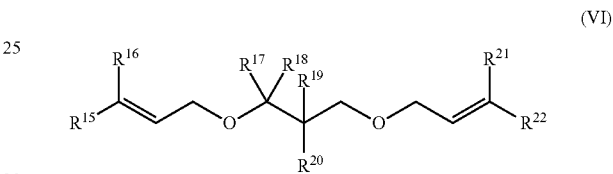

(VI)

(In the general formula (VI), $R^{15}$, $R^{16}$, $R^{21}$, and $R^{22}$ each independently represent an alkyl group having 1 to 6 carbon atoms, an alkoxy group having 1 to 6 carbon atoms, an alkenyl group having 2 to 6 carbon atoms, an aryl group, or an aralkyl group. $R^{17}$ and $R^{18}$ each independently represent a hydrogen atom, an alkyl group having 1 to 6 carbon atoms, an alkoxy group having 1 to 6 carbon atoms, an alkenyl group having 2 to 6 carbon atoms, an aryl group, or an aralkyl group. $R^{19}$ represents a hydrogen atom or a methyl group, and $R^{20}$ represents any one of a hydroxy group, a (meth)acryloyloxy group, a 4-vinylphenoxy group, and an alkenyloxy group having 2 to 6 carbon atoms.)

In the general formula (VI), $R^{19}$ is preferably a hydrogen atom.

The groups represented by each of $R^{15}$, $R^{16}$, $R^{21}$ and $R^{22}$ in the general formula (VI) are the same as those represented by $R^1$ and $R^2$ in the general formula (I), the groups represented by each of $R^{17}$ and $R^{18}$ in the general formula (VI) are the same as those represented by $R^3$ and $R^4$ in the general formula (I), and the groups represented by $R^{20}$ in the general formula (VI) are the same as those represented by $R^{12}$ in the general formula (V). The same applies to these examples and preferable examples, and thus duplicate descriptions will be omitted.

The hydroxy groups are present in molecules of the compounds represented by the general formulas (III) and (IV), and $R^{12}$ and $R^{20}$, which are functional groups exhibiting the electron donating property are present in molecules of the compounds represented by the general formulas (V) and (VI), respectively. Due to the presence of these groups, the electron density at the allyl position is increased while the stability of the compounds is maintained, and whereby oxygen absorbability is easily improved, and adsorptivity of the compound (A) to the metal particles is also easily enhanced. In particular, in the general formulas (III), (V), and (VI), a group having a relatively high electron donating property is bonded to a double bond at both terminals, so that the oxygen absorbability can be easily further improved.

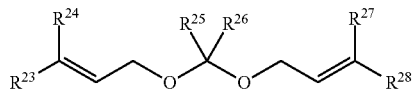
(VII)

(In the general formula (VII), $R^{23}$, $R^{24}$, $R^{27}$, and $R^{28}$ each independently represent an alkyl group having 1 to 6 carbon atoms, an alkoxy group having 1 to 6 carbon atoms, an alkenyl group having 2 to 6 carbon atoms, an aryl group, or an aralkyl group. $R^{25}$ and $R^{26}$ each independently represent a hydrogen atom, an alkyl group having 1 to 6 carbon atoms, an alkoxy group having 1 to 6 carbon atoms, an alkenyl group having 2 to 6 carbon atoms, an aryl group, or an aralkyl group.)

The groups represented by each of $R^{23}$, $R^{24}$, $R^{27}$, and $R^{28}$ in the general formula (VII) are the same as those represented by $R^1$ and $R^2$ in the general formula (I), the groups represented by each of $R^{25}$ and $R^{26}$ in the general formula (VII) are the same as those represented by $R^3$ and $R^4$ in the general formula (I). The same applies to these examples and preferable examples, and duplicate descriptions will be omitted.

Since an acetal structure is present in a molecule of a compound represented by the general formula (VII), the electron density in the vicinity of the structure is high, and oxygen absorbability of the compound may be easily improved.

Specific examples of the compound (A) having the structure represented by the general formula (I) are as follows.

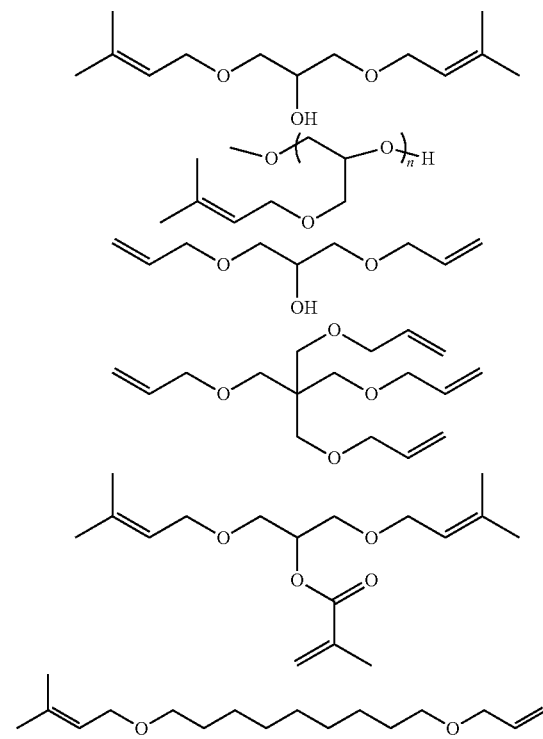

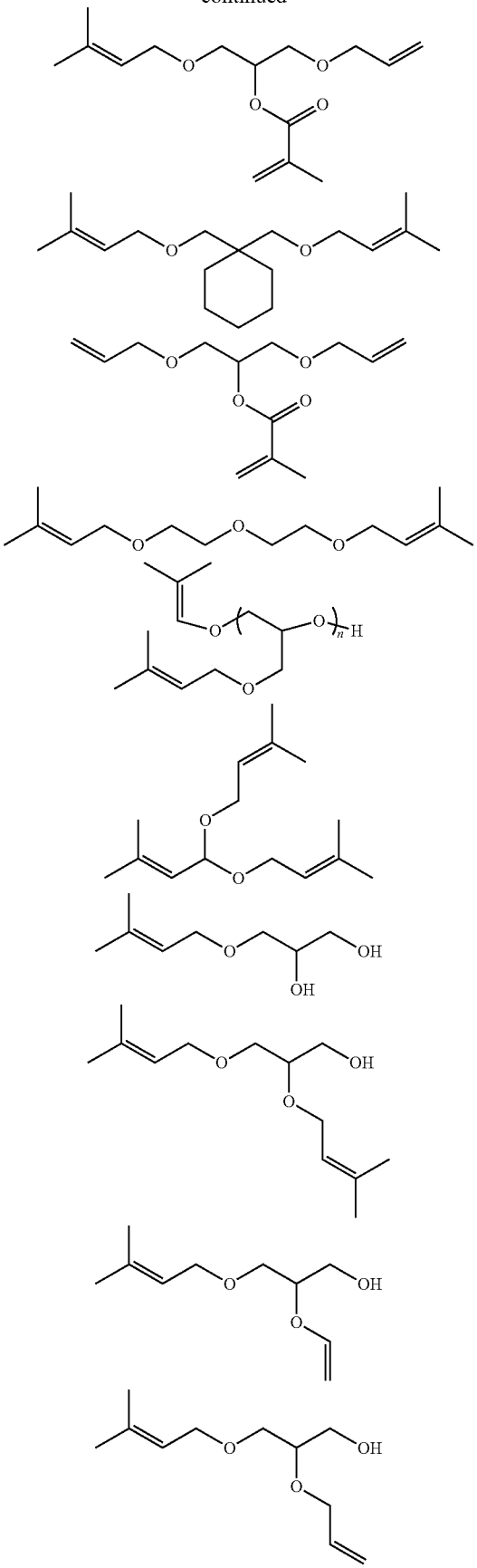

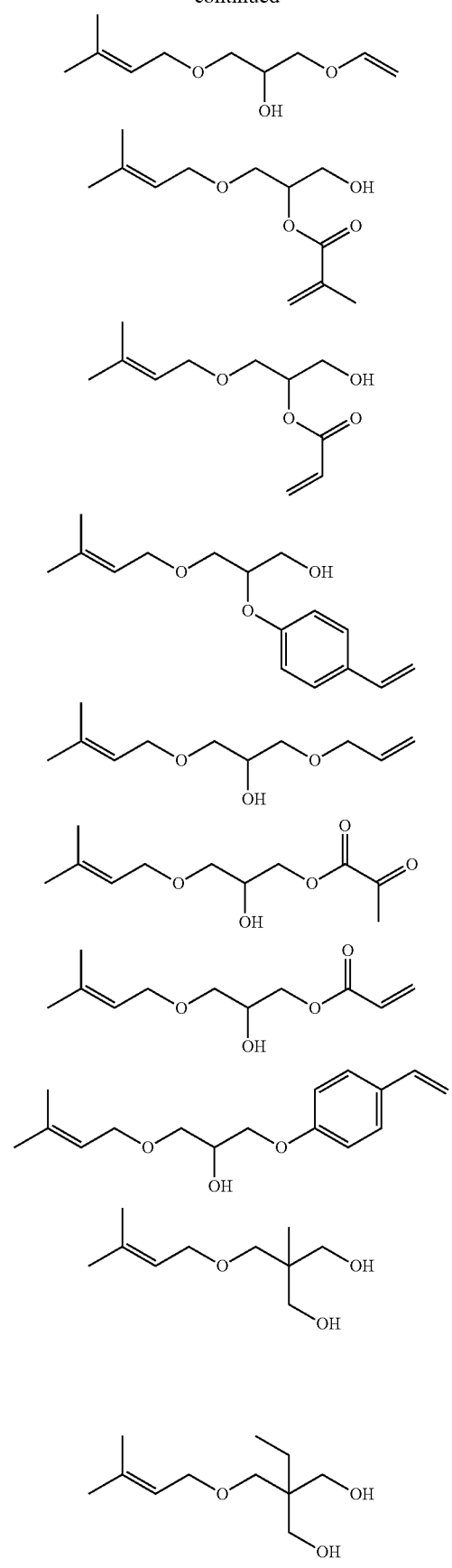

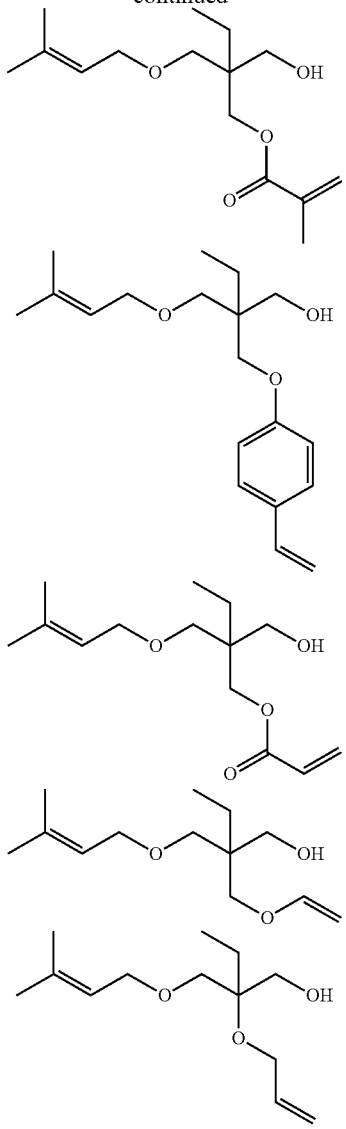

A method for producing the compound (A) having the structure represented by the general formula (I) is not particularly limited, and the compound (A) can be produced by using known methods alone or in combination.

The metal particle composition contains 0.1 to 5 parts by mass of the compound (A) having the structure represented by the general formula (I) with respect to 100 parts by mass of the metal particles. When the content of the compound (A) is less than 0.1 parts by mass, the oxidation resistance cannot be sufficiently obtained. Meanwhile, when the content of the compound (A) is more than 5 parts by mass, the amount of the metal particles is relatively reduced. Therefore, the required amount of metal cannot be ensured, required physical properties such as conductivity cannot be ensured, and a balance between a production cost and the achieved effect deteriorates. From such a viewpoint, the content of the compound (A) is preferably 0.1 to 4 parts by mass, more preferably 0.15 to 3 parts by mass, still more preferably 0.2 to 3 parts by mass, and particularly preferably 0.2 to 2 parts by mass.

Since the compound (A) exhibits an extremely high oxygen absorbability by being present in the vicinity of the metal particles, it enables to improve the oxidation resistance of the metal particles even with a small amount of the compound (A). Therefore, when the amount of the metal particles is desired to be increased as much as possible, the content of the compound (A) may be 0.1 to 1 part by mass, and more preferably 0.1 to 0.5 parts by mass, with respect to 100 parts by mass of the metal particles.

<Other Components>

The metal particle composition may further contain components other than the components described above, such as a diluent, a pigment, a dye, a filler, an ultraviolet absorber, a thickener, a low shrinkage agent, an antiaging agent, a plasticizer, an aggregate, a flame retardant, a stabilizer, a fiber reinforcing material, an antioxidant, a leveling agent, and a dripping inhibitor.

A paste containing the metal particle composition will be described later.

[Method for Producing Metal Particle Composition]

A method for producing the metal particle composition according to the embodiment of the present invention includes a mixing step of mixing the metal particles and the compound (A).

In the mixing step, the metal particles and the compound (A) are mixed so that the compound (A) exists in the vicinity of the metal particles. Therefore, the oxygen near the surface of the metal particles may be easily absorbed by the compound (A).

From a viewpoint of facilitating uniform mixing of the metal particles and the compound (A), the method for producing the metal particle composition preferably further includes a solvent removing step of removing an organic solvent after mixing the metal particles, the compound (A), and the organic solvent in the mixing step.

In the mixing step, an order of adding the respective components is not particularly limited, and the metal particles may be added after the compound (A) is mixed with the organic solvent, or the compound (A) may be added after the metal particles are mixed with the organic solvent, or the compound (A) and the metal particles may be simultaneously added to the organic solvent.

In the mixing step, other components used as necessary may be mixed together with the metal particles and the compound (A). An order of adding the other components is not particularly limited, and the other components may be added to the organic solvent together with the compound (A) or may be added to the organic solvent together with the metal particles.

In the solvent removing step, the organic solvent is distilled off by an evaporator or the like to remove the organic solvent from the mixture prepared in the mixing step, thereby obtaining the metal particle composition.

Examples of the organic solvent used in the production of the metal particle composition include acetone, methanol, and tetrahydrofuran.

The amount of the organic solvent used is not particularly limited, and is, for example, 1 L to 10 L with respect to 10 g of the compound (A).

[Application of Metal Particle Composition]

The metal particle composition is excellent in oxidation resistance and is applicable to existing metal particles without the transition metal catalyst, and thus is usable in a wide range of fields, and is usable as, for example, a raw material powder for powder metallurgy a baking paste for a multilayer ceramic capacitor, and a material used for a conductive paste or a conductive ink for forming a wiring by inkjet printing or the like.

[Paste]

The paste according to the embodiment of the present invention contains the metal particle composition. As described above, since the metal particle composition is excellent in oxidation resistance, even if the particle diameter of the metal particles is small, the paste hardly causes problems such as an increase in electrical resistance and a decrease in thermal conductivity.

As described above, since the paste hardly causes problems such as the increase in electrical resistance and the decrease in thermal conductivity even if the particle diameter of the metal particles is small, the paste is usable, for example, in the conductive paste for wiring formation of an electronic component or the fired paste for the multilayer ceramic capacitor.

The paste may contain a binder.

Examples of the binder include a binder containing a resin and a solvent. The paste containing the binder enables to provide a function of adhering and solidifying the metal particles to an object such as a printed wiring board.

The resin contained in the binder is preferably a thermosetting resin or an ultraviolet curable resin. The resin may be a resin that is cured by other energy rays such as an electron beam. For example, when the resin is a thermosetting resin, the paste can be solidified by being heated, and when the resin is an ultraviolet curable resin, the paste can be solidified by irradiating the paste with ultraviolet light.

The thermosetting resin is not particularly limited, and examples thereof include various modified polyester resins such as a polyester resin, a urethane-modified polyester resin, an epoxy-modified polyester resin, and an acrylic-modified polyester resin, a polyurethane resin, a polyether urethane resin, a polycarbonate urethane resin, an acrylic urethane resin, a vinyl chloride-vinyl acetate copolymer, an epoxy resin, a modified epoxy resin, a phenol resin, an acrylic resin, an alkyd resin, an alkyd phenolic resin, a butyral resin, a polyvinyl butyral resin, an ethylene-vinyl acetate copolymer, polyamide-imide, polyimide, polyamide, and modified cellulose such as nitrocellulose, cellulose acetate butyrate, and cellulose acetate propionate. These thermosetting resins may be used alone or in combination of two or more. A thermal polymerization catalyst such as a peroxide may be used in combination with the thermosetting resin.

As the ultraviolet curable resin, a photopolymerizable monomer is used. That is, photopolymerizable monomers are polymerized to obtain the ultraviolet curable resin.

The photopolymerizable monomer is not particularly limited, and examples thereof include 2-hydroxyethyl (meth) acrylate, 2-hydroxypropyl (meth)acrylate, diethylene glycol di(meth)acrylate, triethylene glycol di(meth)acrylate, polyethylene glycol di(meth)acrylate, polyurethane di(meth) acrylate, trimethylol propanetri(meth)acrylate, pentaerythritol tri(meth)acrylate, pentaerythritol tetra(meth)acrylate, trimethylolpropane ethylene oxide-modified tri(meth)acrylate, dipentaerythritol penta(meth)acrylate, and dipentaerythritol hexa(meth)acrylate.

These photopolymerizable monomers may be used alone or in combination of two or more kinds thereof. Further, a photopolymerization initiator, a photosensitizer, or the like may be used in combination with the ultraviolet curable resin.

The solvent contained in the binder has a function of mixing the metal particles and the resin. The solvent is volatilized and removed when the paste is adhered and solidified to an object such as a printed wiring board.

The solvent is not particularly limited as long as the solvent is inert, and examples thereof include ketones such as methylethylketone and cyclohexanone, aromatic hydrocarbons such as toluene, xylene, ethylbenzene, and tetramethylbenzene, aliphatic hydrocarbons such as hexane, heptane, decane, octane, cyclohexane, methylcyclohexane, and ethylcyclohexane, glycol ethers such as cellosolve, methyl cellosolve, carbitol, methyl carbitol, butyl carbitol, ethylene glycol monoethyl ether, ethylene glycol monobutyl ether, diethylene glycol dimethyl ether, triethylene glycol monoethyl ether, triethylene glycol monobutyl ether, propylene glycol monomethyl ether, dipropylene glycol monomethyl ether, dipropylene glycol monoethyl ether, and tripropylene glycol normal butyl ether, esters such as ethyl acetate, butyl acetate, dihydroterpineol acetate, isobornyl acetate, isobornyl propionate, isobornyl butyrate, isobornyl isobutyrate, cellosolve acetate, methyl cellosolve acetate, ethyl cellosolve acetate, propyleneglycol monomethyl ether acetate, ethyl-3-ethoxypropionate, butyl cellosolve acetate, carbitol acetate, butyl carbitol acetate, propylene glycol monomethyl ether acetate, and 2,2,4-trimethyl-1,3-pentanediol monoisobutyrate, alcohols such as ethanol, propanol, ethylene glycol, propylene glycol, terpineol, and butyl carbitol, and esters of a higher alcohol and a carboxylic acid. These solvents may be used alone or in combination of two or more kinds thereof.

A content of the binder in the paste is preferably 10 to 50 parts by mass, and more preferably 12.5 to 33.3 parts by mass with respect to 100 parts by mass of the metal particles, from a viewpoint of conductivity and adhesion.

A viscosity of the paste at 25° C. is preferably 10 mPa s to 200,000 mPa s, and more preferably 1,000 mPa s to 100,000 mPa s, from a viewpoint of handleability. The viscosity can be measured by, for example, a cone plate-type viscometer. When the paste is applied to an object by being blown from a nozzle such as an inkjet, the paste may be further diluted with an organic solvent or the like before use.

A thixotropic ratio of the paste at 25° C. is preferably 1.0 to 4.0, and more preferably 1.5 to 3.5, from the viewpoint of handleability. Here, the thixotropic ratio at 25° C. is a value represented by a viscosity at a shear rate of 10 $s^{-1}$ at 25° C./a viscosity at a shear rate of 100 $s^{-1}$ at 25° C.

The shape of the metal particles contained in the metal particle composition constituting the paste is not particularly limited and may be any of various shapes as described above, and the shape is particularly preferably a spherical shape.

When the metal particles contained in the paste are spherical, the fluidity is improved. Therefore, when a paste containing spherical metal particles is blown from a nozzle such as an inkjet head to an object, clogging of the nozzle can be easily prevented, and by extension, a conductive circuit or the like of a printed wiring board can be easily formed at a desired position.

The paste may further contain various components listed as other components that may be contained in the metal particle composition.

The paste may contain a conductive organic compound. As the conductive organic compound, a conjugated organic compound having conductivity can be used, and examples thereof include polycyclic aromatics such as pentacene, a conductive polymer such as polyacetylene, poly(p-phenylene vinylene), polypyrrole, polythiophene, polyaniline, poly(p-phenylene sulfide), and polyphenylene vinylene, and a conductive liquid crystal.

Among these conductive organic compounds, from a viewpoint of further improving the conductivity the conductive liquid crystal is preferable, and a mixture of two or more kinds of conductive liquid crystals is more preferable. The conductive liquid crystal is regularly oriented between the metal particles to further improve the conductivity of the paste.

A method for producing the paste is not particularly limited, and various production methods, which are known in the related art, can be used. For example, the paste can be produced by mixing the metal particle composition, the binder, and other components used as necessary by a known method.

The paste is applied to an object such as a printed wiring board, followed by performing a heat-treatment at, for example, 100° C. or higher, and thereby the solvent in the binder is volatilized, and when the resin in the binder is a thermosetting resin, the resin is cured. When the resin in the binder is an ultraviolet curable resin, the resin is cured by irradiation with ultraviolet light after or in addition to heating.

In this way, when the paste is solidified, the adjacent metal particles can be adhered and solidified on the printed wiring board or the like in a uniformly dispersed state while maintaining a state in which the adjacent metal particles are in contact with each other or a state in which the adjacent metal particles are connected to each other via the conductive organic compound.

EXAMPLES

Hereinafter, the present invention will be described in detail with reference to Examples, but the present invention is not limited to these Examples.

A method for evaluating compositions obtained in Examples and Comparative Examples will be described below.

<Proportion of Oxidized Metal Particles>

In order to evaluate oxidation resistance of the compositions, a proportion of oxidized metal particles was measured by the following procedure.

100 mg of each of metal particle compositions obtained in Examples 1 to 10 and Comparative Examples 2 to 4, which will be described later, and 100 mg of metal particles of Comparative Example 1 were used and heated at 80° C. for 5 hours in air. 5 mL of a 10% aqueous hydrochloric acid solution was added to each of the heated metal particle compositions and the heated metal particles, and an obtained solution was allowed to stand overnight. A supernatant of the obtained solution was subjected to UV-vis absorption spectroscopy analysis using a UV spectrometer (UV-3900 manufactured by Hitachi High-Tech Science Co., Ltd.), and quantified by absorbance at 820 nm using copper (II) chloride as a standard, and the proportion of oxidized copper particles was calculated.

100 mg of a metal particle composition obtained in Example 11 described later and 100 mg of metal particles of Comparative Example 5 were used and heated at 80° C. for 5 hours in air. 10 mL of a 10% bromine methanol solution was added to the heated metal particle composition and the heated metal particles, and an obtained solution was allowed to stand overnight. The proportion of oxidized iron particles was calculated by weighing the residue.

<Thermogravimetric Analysis>

Regarding the metal particle composition obtained in Example 1 described later, a sample was heated from room temperature to 600° C. in a nitrogen atmosphere using a thermogravimetric differential thermal analyzer (TGA-50, manufactured by Shimadzu Corporation). Then, by analyzing changes in weight of each sample after heating, the remaining amount of components other than the metal particles due to the addition of the compound (A) to the metal particles was examined.

The metal particles and the compounds used in Examples and Comparative Examples are as follows.

<Metal Particle>
  Copper particles: Copper powder manufactured by FUJIFILM Wako Pure Chemical Corporation, maximum particle diameter: 75 μm
  Iron particle: Atomized iron powder manufactured by FUJIFILM Wako Pure Chemical Corporation, maximum particle diameter: 180 μm <Compound (A)>
  Compound (A-1): 1,3-bis(3-methyl-2-butenoxy)-2-hydroxypropane
  Compound (A-2): α-(3-methyl-2-butenoxy)-o-hydroxypoly[oxy(3-methyl-2-butenoxymethylethane-1,2-diyl)]
  Compound (A-3): α-methoxy-o-hydroxypoly[oxy(3-methyl-2-butenoxymethylethane-1,2-diyl)]
  Compound (A-4): pentaerythritol tetraallyl ether
  Compound (A-5): 1,9-bis(3-methyl-2-butenoxy)-nonane
  Compound (A-6): cyclohexane-1,1-bis(3-methyl-2-butenoxy-methanol)
  Compound (A-7): diethylene glycol-bis(3-methyl-2-butene)ether
  Compound (A-8): 1,1-bis(3-methyl-2-butenoxy)-3-methyl-2-butene <Comparative Compound>
  Prenol (manufactured by Kuraray Co., Ltd.)
  Prenylation acetate (manufactured by FUJIFILM Wako Pure Chemical Corporation)
  MDEA: methyldiethanolamine (manufactured by FUJIFILM Wako Pure Corporation)

Compounds (A-1) to (A-8) were synthesized by the following methods.

[Production Example 1] (Synthesis of Compound (A-1))

Into a reactor equipped with a stirrer, a thermometer, and a dropping funnel, 61.8 g (0.717 mol) of 3-methyl-2-buten-1-ol and 36.84 g (0.657 mol) of potassium hydroxide were charged under a nitrogen gas flow. An internal temperature was maintained at 10° C. or lower, 19.34 g (0.209 mol) of epichlorohydrin was added dropwise while performing stirring, and the temperature was raised to 50° C. after completion of the dropwise addition. The mixture was stirred at the internal temperature of 50° C. for 6 hours and then cooled to 25° C. The reaction solution was neutralized with a 4M aqueous hydrochloric acid solution, and an upper layer was washed with 310 mL of ion exchanged water. The obtained organic layer was purified by distillation to obtain 28.77 g of 1,3-bis(3-methyl-2-butenoxy)-2-hydroxypropane (0.126 mol; yield: 60.3%) represented by the following formula (A-1).

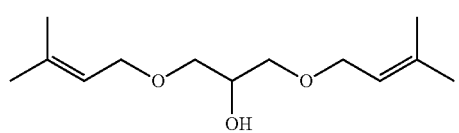

(A-1)

[Production Example 2] (Synthesis of Compound (A-2))

Into a reactor equipped with a stirrer, a thermometer, and a dropping funnel, 1,654 g (19.2 mol) of 3-methyl-2-buten-1-ol, 1,842 g (23.0 mol) of a 50% sodium hydroxide aqueous solution, 28 g (0.084 mol) of dodecylbenzyldimethylammonium chloride were charged under a nitrogen gas flow. An internal temperature was maintained at 60° C. or lower, 1,776 g (19.2 mol) of epichlorohydrin was added dropwise while performing stirring, and the temperature was raised to 90° C. after completion of the dropwise addition. The mixture was stirred at the internal temperature of 90° C. for 9 hours and then cooled to 25° C. The reaction solution was washed with 5,000 g of a 7.5% aqueous sodium hydrogen carbonate solution, and then an upper layer was washed with 5,000 mL of ion exchanged water. Water and unreacted 3-methyl-2-buten-1-ol were distilled off from the obtained organic layer by distillation to obtain 1,996 g of α-(3-methyl-2-butenoxy)-ω-hydroxypoly[oxy(3-methyl-2-butenoxymethylethane-1,2-diyl)] (yield: 73%) represented by the general formula (A-1). From a GPC measurement, a number average molecular weight of the obtained compound was equal to 300, and a weight average molecular weight was equal to 360 (in terms of polystyrene).

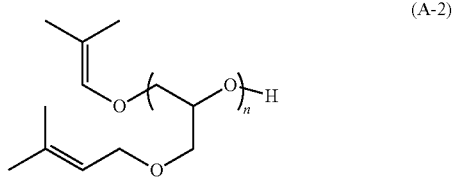

(A-2)

Reference Example 1

Synthesis of 1-(3-methyl-2-butenoxy)-2,3-epoxypropane

Into a reactor equipped with a stirrer, a thermometer, and a dropping funnel, 324 g of 3-methyl-2-buten-1-ol (manufactured by Kuraray Co., Ltd., 3.77 mol), 2,300 mL of cyclohexane, 226 g of sodium hydroxide (manufactured by FUJIFILM Wako Pure Chemical Corporation, 5.65 mol), 15.2 g of trioctylmethylammonium chloride (manufactured by Tokyo Chemical Industry Co., Ltd., 37.3 mmol) and 226 mL of purified water were charged under a nitrogen air flow. An internal temperature was maintained at 25° C. or lower, 698 g of epichlorohydrin (manufactured by FUJIFILM Wako Pure Chemical Corporation, 7.54 mol) was added dropwise over 90 minutes while performing stirring, and the temperature was raised to 40° C. over 30 minutes after completion of the dropwise addition. The mixture was stirred at the internal temperature of 40° C. for 3 hours and then cooled to 25° C. An upper layer of the reaction solution was washed 5 times with 670 mL of saturated brine, and the organic layer was dried over sodium sulfate. Thereafter, sodium sulfate was filtered and removed, and the filtrate was concentrated to obtain 536 g of a concentrate. The concentrate was purified by distillation to obtain 242 g of 1-(3-methyl-2-butenoxy)-2,3-epoxypropane (1.67 mol; yield: 44%) shown in the following formula (a).

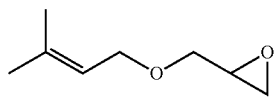

(a)

[Production Example 3] (Synthesis of Compound (A-3))

Into a reactor equipped with a stirrer, a thermometer, and a dropping funnel, 20 g (0.14 mol) of 1-(3-methyl-2-butenoxy)-2,3-epoxypropane and 76 mg (1.4 mmol) of sodium methoxide were charged under a nitrogen gas flow. The mixture was stirred at an internal temperature of 110° C. for 9 hours and then cooled to 25° C. After adding 1 ml of acetic acid to the reaction solution, a low boiling component is removed by evaporation, and 18.8 g of α-methoxy-ω-hydroxypoly[oxy(3-methyl-2-butenoxymethylethane-1,2-diyl)] (yield: 94%) represented by the following general formula (A-3) was obtained. From a GPC measurement, a number average molecular weight of the obtained compound was equal to 4,800, and a weight average molecular weight was equal to 7,600 (in terms of polystyrene).

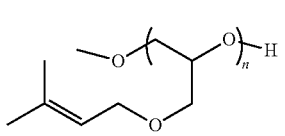

(A-3)

[Production Example 4] (Preparation of Compound (A-4))

A commercially available pentaerythritol tetraallyl ether manufactured by FUJIFILM Wako Pure Chemical Corporation. was used as the compound (A-4) represented by the following general formula (A-4).

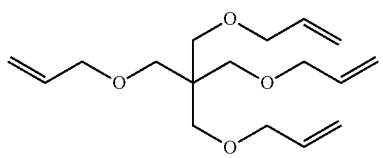

(A-4)

[Production Example 5] (Synthesis of Compound (A-5))

Into a reactor equipped with a stirrer and a thermometer, 24.86 g (155.12 mmol) of 1,9-nonanediol, 19.27 g (343.44 mmol) of potassium hydroxide, and 0.53 g (3.17 mmol) of potassium iodide, and 100.15 g of tetrahydrofuran were charged under a nitrogen gas flow. An internal temperature was raised to 65° C., 35.45 g (338.97 mmol) of 3-methyl-2-butene chloride was added dropwise while performing stirring, and the mixture was stirred at the internal temperature of 65° C. for 6 hours after completion of the dropwise addition. 100 g of ion exchanged water was added to the reaction solution, and the obtained organic layer was purified by distillation to obtain 10.01 g of 1,9-bis(3-methyl-2-butenoxy)-nonane (33.76 mmol; yield: 21.8%) represented by the following general formula (A-5).

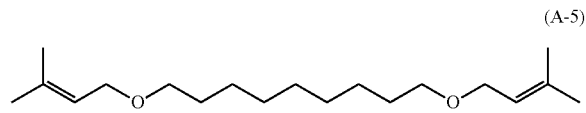

(A-5)

[Production Example 6] (Synthesis of Compound (A-6))

Into a reactor equipped with a stirrer and a thermometer, 25.00 g (173.33 mmol) of cyclohexane-1,1-dimethanol, 21.42 g (381.83 mmol) of potassium hydroxide, 0.59 g (3.53 mmol) of potassium iodide, 100.25 g of tetrahydrofuran, and 10.00 g of diethylene glycol dimethyl ether were charged under a nitrogen gas flow. An internal temperature was raised to 65° C., 39.43 g (377.03 mmol) of 3-methyl-2-butene chloride was added dropwise while performing stirring, and the mixture was stirred at the internal temperature of 65° C. for 6 hours after completion of the dropwise addition. 10.1 g (180.15 mmol) of potassium hydroxide, 1.22 g (7.34 mmol) of potassium iodide, and 9.86 g (94.28 mmol) of 3-methyl-2-butene chloride were added, and stirring was further performed for 35 hours. 100 g of ion exchanged water was added to the reaction solution, and the obtained organic layer was purified by distillation to obtain 17.42 g of cyclohexane-1,1-bis(3-methyl-2-butenoxymethanol) (62.11 mmol; yield: 36%) represented by the following general formula (A-6).

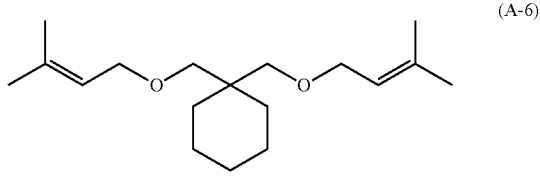

(A-6)

[Production Example 7] (Synthesis of Compound (A-7))

Into a reactor equipped with a stirrer and a thermometer, 25.01 g (235.70 mmol) of diethylene glycol, 29.12 g (519.05 mmol) of potassium hydroxide, 0.79 g (4.73 mmol) of potassium iodide, and 100.30 g of tetrahydrofuran were charged under a nitrogen gas flow. An internal temperature was raised to 65° C., 54.28 g (519.07 mmol) of 3-methyl-2-butene chloride was added dropwise while performing stirring, and the mixture was stirred at the internal temperature of 65° C. for 7 hours after completion of the dropwise addition. 150 g of ion exchanged water was added to the reaction solution, and the obtained organic layer was purified by Distillation to obtain 33.34 g of diethylene glycol-bis(3-methyl-2-butene)ether (137.57 mmol; yield: 58%) represented by the following general formula (A-7).

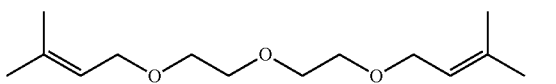

(A-7)

[Production Example 8] (Synthesis of Compound (A-8))

Into a reactor equipped with a stirrer, a thermometer, a condenser, and a Dean-Stark device, 172 g (2.0 mmol) of prenol, 84 g (1.0 mol) of 3-methyl-2-butanal, and 2.6 g (22 mmol) of maleic acid were charged while being stirred under a nitrogen gas flow. An internal temperature was raised to 95° C., an internal pressure was reduced to 10.6 kPa, followed by performing dehydration while performing refluxing, and the mixture was stirred for 4 hours. After adding 4.0 g of sodium carbonate to the reaction solution and performing stirring, the obtained organic layer was purified by distillation to obtain 124 g of 1,1-bis(3-methyl-2-butenoxy)-3-methyl-2-butene (0.52 mol, yield: 52%) represented by the following general formula (A-8).

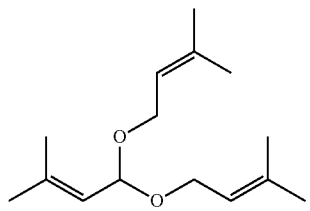

(A-8)

Example 1

To 1 g of the copper particles, 5 mL of acetone and 20 mg of the compound (A-1) (2 parts by mass with respect to 100 parts by mass of the copper particles) were added, followed by stirring the mixture, and acetone was distilled off by evaporation to obtain a metal particle composition. Evaluation results of Example 1 are shown in Table 1.

Examples 2 to 11 and Comparative Examples 1 to 5

Metal particle compositions were obtained in the same manner as in Example 1 except that the kind and amount of the compound (A) to be used and the kind of the metal particles were changed as shown in Tables 1 and 2. In Comparative Example 1 and Comparative Example 5, the metal particles were used alone without adding the compound (A) or the organic solvent. Evaluation results of Examples 2 to 11 and Comparative Examples 1 to 5 are shown in Tables 1 and 2.

TABLE 1

| Components and evaluation items | | | Example 1 | Example 2 | Example 3 | Example 4 | Example 5 | Example 6 | Example 7 |
|---|---|---|---|---|---|---|---|---|---|
| Component amount [Parts by mass] | Metal particles | Copper | 100 | 100 | 100 | 100 | 100 | 100 | 100 |
| | Compound (A) | (A-1) | 2 | 0.5 | 0.2 | — | — | — | — |
| | | (A-2) | — | — | — | 2 | — | — | — |
| | | (A-3) | — | — | — | — | 2 | — | — |
| | | (A-4) | — | — | — | — | — | 2 | — |
| | | (A-5) | — | — | — | — | — | — | 2 |
| | | (A-6) | — | — | — | — | — | — | — |
| | | (A-7) | — | — | — | — | — | — | — |
| | | (A-8) | — | — | — | — | — | — | — |
| | Comparative compound | Prenol | — | — | — | — | — | — | — |
| | | Prenyl Acetate | — | — | — | — | — | — | — |
| | | MDEA | — | — | — | — | — | — | — |
| Evaluation | Proportion of oxidized metal particles | | 13% | 19% | 31% | 13% | 19% | 24% | 17% |

| Components and evaluation items | | | Example 8 | Example 9 | Example 10 | Comparative Example 1 | Comparative Example 2 | Comparative Example 3 | Comparative Example 4 |
|---|---|---|---|---|---|---|---|---|---|
| Component amount [Parts by mass] | Metal particles | Copper | 100 | 100 | 100 | 100 | 100 | 100 | 100 |
| | Compound (A) | (A-1) | — | — | — | — | — | — | — |
| | | (A-2) | — | — | — | — | — | — | — |
| | | (A-3) | — | — | — | — | — | — | — |
| | | (A-4) | — | — | — | — | — | — | — |
| | | (A-5) | — | — | — | — | — | — | — |
| | | (A-6) | 2 | — | — | — | — | — | — |
| | | (A-7) | — | 2 | — | — | — | — | — |
| | | (A-8) | — | — | 2 | — | — | — | — |
| | Comparative compound | Prenol | — | — | — | — | 2 | — | — |
| | | Prenyl Acetate | — | — | — | — | — | 2 | — |
| | | MDEA | — | — | — | — | — | — | 2 |

TABLE 1-continued

| Evaluation | Proportion of oxidized metal particles | 33% | 8% | 91% | 86% | 81% | 80% |
|---|---|---|---|---|---|---|---|

TABLE 2

| Components and evaluation items | | | Example 11 | Comparative Example 5 |
|---|---|---|---|---|
| Component amount [Parts by Mass] | Metal particles | Iron | 100 | 100 |
| | Compound (A) | (A-1) | 2 | — |
| Evaluation | Ratio of oxidized metal particles | | 0% | 8% |

As is clear from the results shown in Table 1, it can be seen that all the metal particle compositions of Examples 1 to 10, which contain the compound (A) having the structure represented by the general formula (I), had a smaller proportion of oxidized particles and excellent oxidation resistance as compared with metal particles of Comparative Example 1 which is a simple substance. It can be seen that, even though the amount of the compound (A) is reduced, the metal particle compositions of Examples 2 and 3 exhibit higher oxidation resistance than compositions of Comparative Examples 2 to 4 that do not contain the compound (A), and the simple substance of the metal particles of Comparative Example 1.

Meanwhile, in the metal particle compositions of Comparative Examples 2 and 3 that contain compounds having structures different from that of the compound (A), the proportion of the oxidized particles was smaller than that of Comparative Example 1, but the proportion of the oxidized particles was much larger than that of the metal particle compositions of Examples 1 to 10. In the metal particle composition of Comparative Example 4 using MDEA, which is a general reducing agent, instead of the compound (A), the proportion of the oxidized particles was much larger than that of the metal particle compositions of Examples 1 to 10. It can be seen that the oxidation resistance of the metal particles cannot be sufficiently improved in the case of a compound having an alcohol structure at a molecular terminal, such as prenol, a compound having an ester structure at a molecular terminal, such as prenyl acetate, and a reducing agent such as MDEA.

As is clear from the results shown in Table 2, it can be seen that even when the iron particles are used as the metal particles, the metal particle composition of Example 11, which contains the compound (A) having the structure represented by the general formula (I), had a smaller proportion of oxidized particles and excellent oxidation resistance as compared with iron particles of Comparative Example 5 which is a simple substance.

As a result of the thermogravimetric analysis of the metal particle composition of Example 1, a total weight of components remaining after heating was the same as a formulation amount of the metal particles. That is, it can be seen that even if the compound (A) was added, no heterogeneous component remains in the metal particles, and the metal particles is usable used at a purity before the compound (A) is added.

The invention claimed is:

1. A metal particle composition comprising, with respect to 100 parts by mass of metal particles, 0.1 to 5 parts by mass of a compound (A) having a structure represented by the following general formula (I):

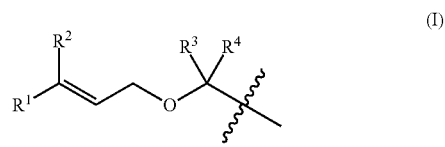

wherein $R^1$ and $R^2$ each independently represent an alkyl group having 1 to 6 carbon atoms, or an alkenyl group having 2 to 6 carbon atoms, $R^3$ and $R^4$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group.

2. The metal particle composition according to claim 1, wherein
$R^1$ and $R^2$ in the general formula (I) are each independently an alkyl group having 1 to 4 carbon atoms.

3. The metal particle composition according to claim 1, wherein
the metal particles are made of at least one metal selected from a group consisting of copper and iron.

4. The metal particle composition according to claim 1, wherein
the compound (A) having the structure represented by the general formula (I) is a compound having a structure represented by the following general formula (II):

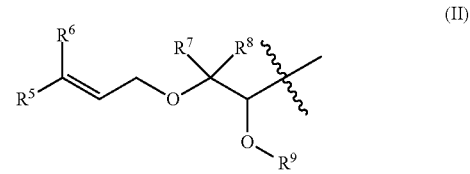

wherein $R^5$ and $R^6$ each independently represent an alkyl group having 1 to 6 carbon atoms, or an alkenyl group having 2 to 6 carbon atoms, $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group, $R^9$ represents a hydrogen atom, a (meth)acryl group, an alkyl group having 1 to 6 carbon atoms, an alkenyl group having 2 to 6 carbon atoms, an aryl group, or an aralkyl group.

5. The metal particle composition according to claim 1, wherein
at least a part of the compound (A) is attached to the metal particles.

6. The metal particle composition according to claim 1, wherein
$R^1$ and $R^2$ in the general formula (I) are each independently an alkyl group having 1 to 4 carbon atoms, and
the metal particles are made of at least one metal selected from a group consisting of copper and iron.

7. The metal particle composition according to claim 1, wherein
$R^1$ and $R^2$ in the general formula (I) are each independently an alkyl group having 1 to 4 carbon atoms, and
the compound (A) having the structure represented by the general formula (I) is a compound having a structure represented by the following general formula (II):

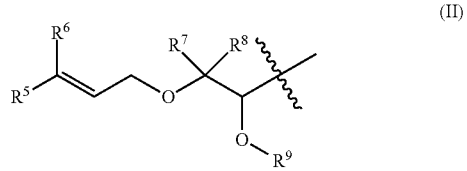

wherein $R^5$ and $R^6$ each independently represent an alkyl group having 1 to 6 carbon atoms, or an alkenyl group having 2 to 6 carbon atoms, $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group, $R^9$ represents a hydrogen atom, a (meth)acryl group, an alkyl group having 1 to 6 carbon atoms, an alkenyl group having 2 to 6 carbon atoms, an aryl group, or an aralkyl group.

8. The metal particle composition according to claim 1, wherein
the metal particles are made of at least one metal selected from a group consisting of copper and iron, and
the compound (A) having the structure represented by the general formula (I) is a compound having a structure represented by the following general formula (II):

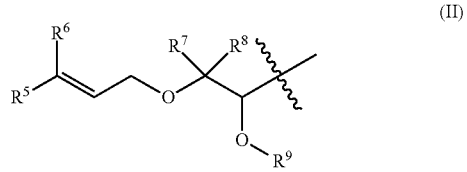

wherein $R^5$ and $R^6$ each independently represent an alkyl group having 1 to 6 carbon atoms, or an alkenyl group having 2 to 6 carbon atoms, $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group, $R^9$ represents a hydrogen atom, a (meth)acryl group, an alkyl group having 1 to 6 carbon atoms, an alkenyl group having 2 to 6 carbon atoms, an aryl group, or an aralkyl group.

9. The metal particle composition according to claim 1, wherein
$R^1$ and $R^2$ in the general formula (I) are each independently an alkyl group having 1 to 4 carbon atoms, and
at least a part of the compound (A) is attached to the metal particles.

10. The metal particle composition according to claim 1, wherein
the metal particles are made of at least one metal selected from a group consisting of copper and iron, and
at least a part of the compound (A) is attached to the metal particles.

11. The metal particle composition according to claim 1, wherein
the compound (A) having the structure represented by the general formula (I) is a compound having a structure represented by the following general formula (II):

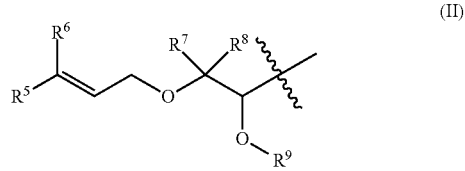

wherein $R^5$ and $R^6$ each independently represent an alkyl group having 1 to 6 carbon atoms, or an alkenyl group having 2 to 6 carbon atoms, $R^7$ and $R^8$ each independently represent a hydrogen atom, an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aryl group, or an aralkyl group, $R^9$ represents a hydrogen atom, a (meth)acryl group, an alkyl group having 1 to 6 carbon atoms, an alkenyl group having 2 to 6 carbon atoms, an aryl group, or an aralkyl group, and
at least a part of the compound (A) is attached to the metal particles.

12. A paste comprising the metal particle composition according to claim 1.

13. A paste comprising the metal particle composition according to claim 2.

14. A paste comprising the metal particle composition according to claim 3.

15. A paste comprising the metal particle composition according to claim 4.

16. A method for producing a metal particle composition, which is a method for producing the metal particle composition according to claim 1, the method comprising mixing the metal particles and the compound (A).

17. The method for producing the metal particle composition according to claim 16, the method further comprising removing an organic solvent after mixing the metal particles, the compound (A), and the organic solvent.

18. A method for producing a metal particle composition, which is a method for producing the metal particle composition according to claim 2, the method comprising mixing the metal particles and the compound (A).

19. A method for producing a metal particle composition, which is a method for producing the metal particle composition according to claim 3, the method comprising mixing the metal particles and the compound (A).

20. A method for producing a metal particle composition, which is a method for producing the metal particle composition according to claim 4, the method comprising mixing the metal particles and the compound (A).

\* \* \* \* \*